United States Patent

Willett et al.

[11] Patent Number: 5,841,649
[45] Date of Patent: Nov. 24, 1998

[54] CURRENT-SENSING MOSFETS IN PARALLELED MOSFET POWER CIRCUIT

[75] Inventors: David T. Willett, Santa Barbara; Edward M. Halimi, Montecito, both of Calif.

[73] Assignee: Turbodyne Systems, Inc., Carpinteria, Calif.

[21] Appl. No.: 782,566

[22] Filed: Jan. 10, 1997

[51] Int. Cl.[6] .................................................. H02M 3/24
[52] U.S. Cl. ............................ 363/98; 363/132; 327/404
[58] Field of Search ............................. 363/17, 58, 56, 363/132, 98; 327/404

[56] References Cited

U.S. PATENT DOCUMENTS

| | | |
|---|---|---|
| 4,967,132 | 10/1990 | Rozman et al. .......................... 318/798 |
| 5,034,796 | 7/1991 | Zommer .................................... 257/467 |
| 5,332,954 | 7/1994 | Lankin ...................................... 318/139 |
| 5,436,786 | 7/1995 | Pelly et al. ................................. 361/56 |

*Primary Examiner*—Shawn Riley
*Attorney, Agent, or Firm*—Brinks Hofer Gilson & Lione

[57] ABSTRACT

Six sets of parallel-connected MOSFETs are gated to provide a 3-phase output. At least one of the MOSFETs in each of three sets of the six sets has a separately metallized current-sensing pad. The output from this pad represents the phase current. When phase current reaches a maximum permissible level, this signal controls the MOSFET gates to limit current.

15 Claims, 2 Drawing Sheets

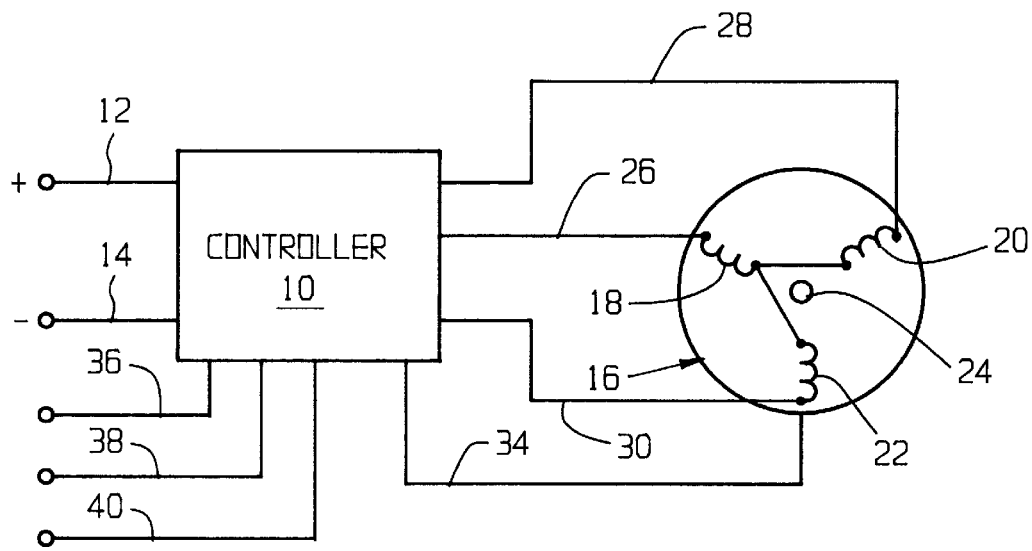
Fig. 1
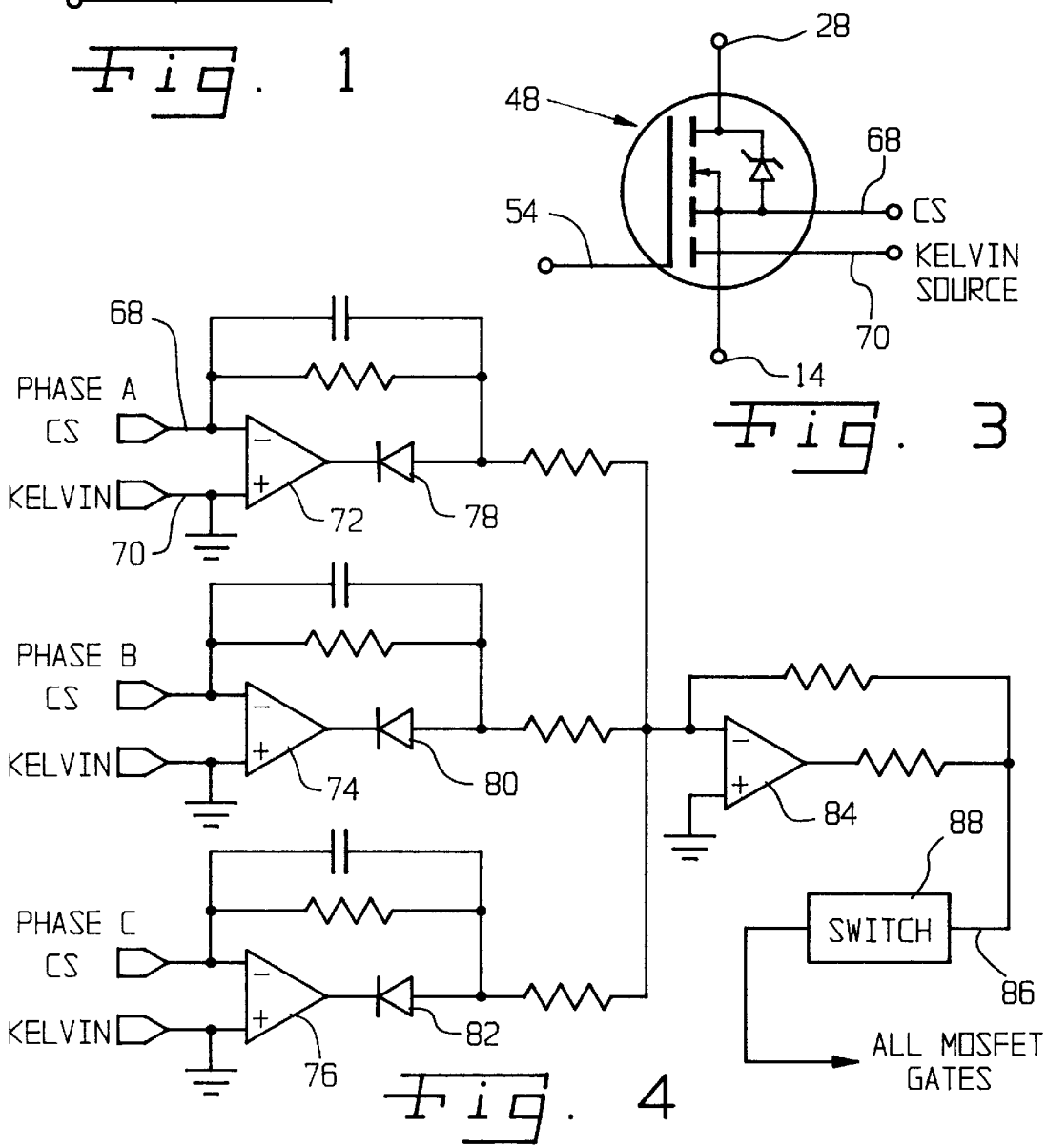
Fig. 3
Fig. 4

5,841,649

CURRENT-SENSING MOSFETS IN PARALLELED MOSFET POWER CIRCUIT

FIELD OF THE INVENTION

This invention is directed to power electronics circuits that utilize multiple parallel MOSFETs to process high levels of current and require a means of detecting that current for the purpose of protecting the MOSFETs from an over-current condition. Particularly, this invention is directed to the use of a 3-phase brushless motor controller used to drive a 3-phase permanent magnet motor.

BACKGROUND OF THE INVENTION

Over-current protection in power electronics circuits is often necessary in order to prevent damage to the power semiconductors in the event of a fault or other condition that would cause the current in the device to exceed the maximum allowable operating limits. Many different ways of providing this protection have been developed and used in the past, but each has its limitations.

In low current circuits, the current flowing through the MOSFET is passed through a "shunt resistor" that develops a voltage across it which is representative of the current in the MOSFET. This voltage is then sensed and used to turn off the MOSFET in the event of a current that exceeds the MOSFET or circuit maximum safe operating level. As the current in the device grows, the power loss in the shunt resistor grows with the square of that current, $$P = I^2 * R,$$

eventually reaching a level that makes the use of a shunt resistor impractical due to the large amount of power that must be dissipated in the form of heat. The resistance of the current-sensing resistor can be lowered to reduce the power loss, but eventually the voltage produced across the power sensing resistor will become similar in magnitude to the noise level in the circuit, and thus unusable. An additional drawback of using a shunt resistor is that it adds to the parasitic inductance of the power circuit, which causes higher voltage spikes during turn-on and turn-off of the MOSFETs, decreasing their useful operating limits.

In the case of very high currents, an alternative method of sensing the current is to use either a Hall Effect current-sensing device or a current transformer. Both methods are bulky, costly, and reduce ease of manufacture and reliability of the product.

SUMMARY OF THE INVENTION

In order to aid in the understanding of this invention, it can be stated in essentially summary form that it is directed to a MOSFET circuit which includes a plurality of paralleled MOSFETs for controlling and supplying current. Some of the paralleled MOSFETs are configured with a sensing pad which represents parallel and proportional sensing current. The sensing pads are connected to control and limit the main current. The MOSFET power circuit has a 3-phase output for driving the electric motor in a structure comprising, for example, a gas turbine, an electric motor, and a turbocharging compressor.

It is, thus, a purpose and advantage of this invention to provide a power circuit which incorporates therein current-sensing MOSFETs with the output of the current sensors being connected to control a 3-phase motor circuit.

It is a further purpose of this invention to provide a current-sensing MOSFET in a paralleled MOSFET power circuit which is connected to drive and control an electric motor for a charging compressor so as to provide an internal combustion engine with charging air when required while limiting motor current to safe levels.

It is a further purpose and advantage of this invention to provide a current-sensing MOSFET in a paralleled MOSFET power circuit which is connected to drive and control an electric motor in an exhaust gas turbine-electric motor-internal combustion engine charging compressor so as to provide internal combustion engine charging air when required, but limit current to the motor to safe levels.

The features of the present invention which are believed to be novel are set forth with particularity in the appended claims. The present invention, both as to its organization and manner of operation, together with further objects and advantages thereof, may be best understood by reference to the following description, taken in conjunction with the accompanying drawing.

BRIEF DESCRIPTION OF THE DRAWINGS

FIG. 1 is a schematic controller-motor combination.

FIG. 3 is a schematic diagram of a MOSFET with a current-sensing pad.

FIG. 4 is an electrical schematic diagram showing the combining of the current-sensing signals for input to the motor controller.

DESCRIPTION OF THE PREFERRED EMBODIMENT

Figure 2:
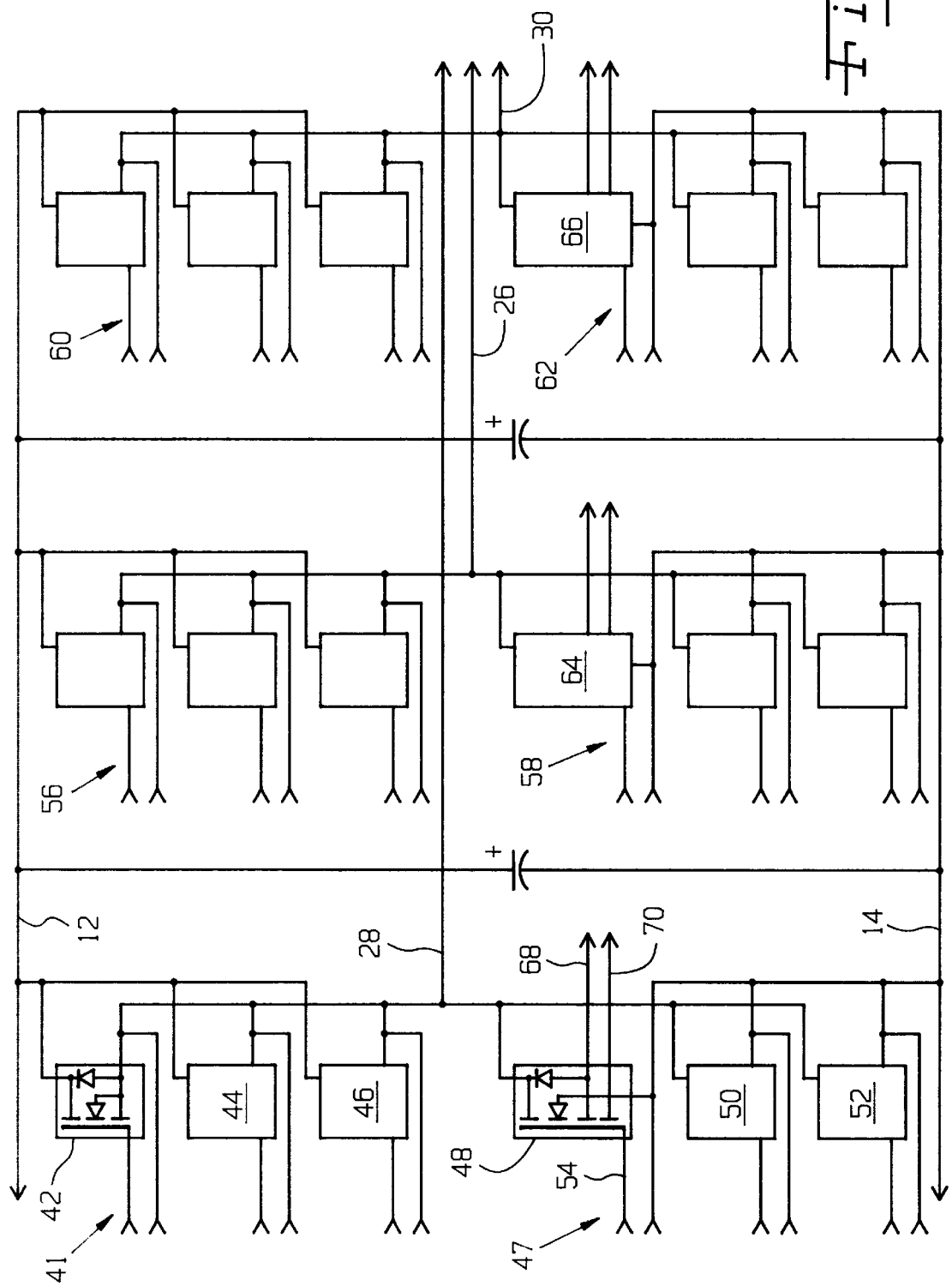
FIG. 2 is a schematic showing a plurality of MOSFETs connected in parallel to power 3-phase windings for a 3-phase permanent magnet motor.

Controller 10, shown in FIG. 1, has power inputs 12 and 14. In view of the fact that the controller is to control a motor 16 which is mounted on a vehicle, the power input is likely to be direct current. However, the inventive circuit is useful in other applications and, thus, may have an AC input, with appropriate power conditioning. The motor 16 has three windings 18, 20 and 22 which are powered to produce a rotating magnetic field around permanent magnet rotor 24. The phase windings are powered from the controller by lines 26, 28 and 30. The phase windings are wye-connected, although they could be delta-connected. Line 34 represents the motor position sensor lines back to the controller 10 from the conventional motor position sensors for this type of motor, although it should be understood that sensorless motors can be used. The controller has a plurality of inputs for management of the motor 16. Three principal inputs are transmission status line 36, throttle position line 38 and enabling line 40. The enabling line 40 permits the operator to turn the controller 10 on or off. In the off position, the motor 16 is not powered. In the on position, the controller 10 powers the motor 16 in accordance with the performance of other inputs, including the transmission status and the throttle position.

Referring to FIG. 2, representative blocks have been used for clarity and convenience of illustration, to avoid repetition of the schematic drawings of MOSFETs. Thus, it is seen that a set 41 of three MOSFETs 42, 44 and 46 is connected between power line 12 and phase line 28. The MOSFETs 42, 44 and 46 in set 41 of MOSFETs act in parallel to supply power to the phase line 28. Similarly, a set 47 of three MOSFETs 48, 50 and 52 is connected between power line 14 and phase line 28 to supply power to the phase line 28. The MOSFETs 42, 44, 46, 50 and 52 are identical and have their gate lines connected in the controller to control the AC output frequency. Gate line 54 is illustrated for MOSFET 48. The other gate lines are similar. A set 56 of MOSFETs identical to set 41 is connected between power line 12 and power phase line 26. A set 58 of MOSFETs identical to set 47 is connected to the power line 14 and power phase line 26. A set 60 of MOSFETS identical to set 41 or set 56 is connected to the power line 12 and power phase line 30. A set 62 of MOSFETS identical to set 47 or set 58 is connected to power line 14 and power phase line 30. Each of the MOSFETs has a gate line, and the gate lines are all connected to the controller so that each of the sets conducts at a proper frequency and duration to create a rotating 3-phase field in motor 16. The rate of rotation of the field is controlled by the gate control. Each of the MOSFETs has a plurality of pads and current paths so that each of the MOSFETs represents a plurality of paths. A sufficient number can be operated in parallel to provide adequate total current to provide the AC field in an efficient, simple, robust and inexpensive manner. As many parallel-connected MOSFETs may be employed as are required for the current requirements.

MOSFET 48 is different than its companion MOSFETs in sets 41 and 47. Similarly, MOSFETs 64 and 66 are also different than their companion parallel-connected MOSFETS. The MOSFETs 48, 64 and 66 are current-sensing MOSFETs. The current-sensing MOSFET consists of two paralleled MOSFETs with isolated sources commonly referred to as a power device and a sense device. The ratio of the current in the sense device to the current in the power device is approximately equal to the ratio of the number of cells in each device, respectively.

MOSFET 48 is shown in more schematic detail in FIG. 3. The die is made with many transistor cells acting in parallel. When the device is on, current flows from drain to source through a narrow channel region around the edge of each cell. Since current is carried by majority carriers in the channel region, the drain current is distributed relatively evenly among the cells and varies little from device to device of the same type. Therefore, drain current can be determined by measuring the current passing through a small number of cells and multiplying it by a scaling factor which is known for a particular device type. The source region of the sensing cells is covered with an isolated metallization which is connected to an external pin by a separate bonding pad and bonding wire and is referred to as the "sensing terminal" with the notation CS. Sensing lead 68 is shown in FIG. 3. Two terminal connections are made to the source metallization of the main cells by separate bonding wires. These are the power source pin shown in FIG. 3 as connected to line 14 and the Kelvin source pin 70. In practice, the device consists of two paralleled MOSFETs with sources 14 and 70. The paralleled MOSFETs are commonly referred to as a power device and as a sense device, both on the same chip. The key parameter of this combination is the current-sensing ratio. This is the ratio between the current in the source pin and the current in the sense pin. Under deal conditions of equal enhancement of all cells and perfect source metallization, the current-sensing ratio would be the ratio of the number of cells in the power device to the number of cells in the sense device and, as a practical matter, such ratio is fairly accurate.

The accuracy of current measurement is somewhat degraded by some parasitic resistance elements that upset the current partitioning between the power device and the sense device. To minimize the effective metallization resistance, the Kelvin contact 70 has been placed at the center of the die, close to the current sense CS pin. The effective parasitic resistance can be compensated for by returning the Kelvin pin signal to the non-inverting input of the companion operational amplifier so that the sense CS terminal, connected to the inverting input, is raised above ground by a voltage drop that approaches the drop across the parasitic resistances. In addition, in the present power circuit in which very fast switching is required, the Kelvin contact represents a useful method of bypassing the common source inductance, which is one of the main limitations in switching speed. Inductance that is common to the drain circuit and to the gate circuit establishes a feedback into the gate drive circuit. In the usual circuit, this voltage reduces the net available gate voltage and slows down the switching.

As seen in FIG. 4, the CS sensing lead 68 and Kelvin source KS lead 70 are fed into operational amplifier 72. The corresponding leads from MOSFET 64 are fed to operational amplifier 74, and the corresponding leads from MOSFET 66 are fed to operational amplifier 76. The current in the CS sense device can be converted to a voltage that is representative of the total current in both the sense device and the power device. Each of the three operational amplifiers in FIG. 4 functions as a current-to-voltage converter, converting the CS sense device current in each sense-FET to a representative voltage. The current-to-voltage converters also contain a first order filter to eliminate high frequency noise problems.

Only one sense-FET (or group of parallel MOSFET sets such as sets 41 and 47 containing a sense-FET 48) will be turned on at a time. However, because the motor 16 is inductive, when one group of transistors (connected to the positive power bus 12) turns off, the current in the motor will continue to flow momentarily through the intrinsic diodes in the lower group (connected to the negative bus 14) of MOSFETs in the same transistor pole. This can cause the sense device current in the sense-FET in that particular lower group of MOSFETs to conduct in the opposite direction from normal, affecting the total output of the final summing amplifier.

The diodes 78, 80 and 82 on the outputs of each of these three op-amps 72, 74 and 76, respectively, rectify the signals allowing only negative outputs and, thus, eliminating the effect of the current flowing in the wrong direction in the sense device of the sense-FET.

The operational amplifier 84 of FIG. 4 functions as a summing amplifier, summing the outputs of the current-to-voltage converters into a single signal in line 86 to a switch 88 that is used to interpret the total instantaneous current flowing in any of the three groups of parallel MOSFETs containing a sense-FET. The circuit shown in FIG. 4 processes the sense-FET output and generates a voltage on line 86 that indicates the maximum current in any of the three sets of paralleled groups of MOSFETs at any instant of time. This signal is then used as a feedback to switch 88 within the controller 10 to turn off the gate source voltage to the MOSFETs when the current exceeds the predetermined maximum safe operating level.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A power circuit comprising:
   a plurality of MOSFETs connected in parallel to control the current in an electric power circuit, each of said MOSFETs having a power source and a drain connected in said power circuit and each of said MOSFETs having a gate for controlling current flow in said MOSFET, at least one of said MOSFETs having a separately metallized sense pad for sensing current flow in said at least one MOSFET to represent current flow through all said parallel connected MOSFETs;

and a circuit connected with said gates and with said separately metallized sense pad, said circuit, in response to a signal from said sense pad, operating said MOSFET gates to limit MOSFET current in said plurality of MOSFETS.

2. The power circuit of claim 1 wherein said circuit comprises a current to voltage converter portion connected to said sense pad and a switch portion operated by said current to voltage converter portion to turn off said MOSFET gates.

3. The power circuit of claim 2 wherein said current to voltage converter portion comprises an operational amplifier with an output connected with said switch portion.

4. The power circuit of claim 3 further comprising a blocking diode connected between the output of the operational amplifier and the switch portion of the circuit.

5. The power circuit of claim 1 wherein said at least one MOSFET also has a separate Kelvin metallization.

6. The power circuit of claim 5 wherein said Kelvin metallization is coupled to said circuit to provide a further signal to control said gates of said MOSFETs.

7. The power circuit of claim 6 wherein said circuit comprises a current to voltage converter portion connected to said sense pad and said Kelvin metallization, and a switch portion operated by said current to voltage converter portion in response to signal from said sense pad and said Kelvin metallization.

8. The power circuit of claim 7 wherein said current to voltage converter is an operational amplifier with the sense pad connected with its inverting input and the Kelvin metallization connected with its non-inverting input, and with its output and inverting input connected to provide high frequency filtering.

9. The power circuit of claim 8 further comprising a blocking diode in the output of the operational amplifier.

10. A power circuit for controlling a 3-phase motor, comprising:

a source of direct current;

first, second and third sets of parallel connected MOSFETs connected to said source of direct current;

first, second and third phase lines, said first, second and third sets of MOSFETs being respectively connected to said first, second and third phase lines so that energization of one set of MOSFETs energizes its corresponding phase line;

each of said sets of parallel connected MOSFETs comprising a plurality of individual MOSFETs, each individual MOSFET having a drain, a power source and a gate, said gates of said individual MOSFETs in a set being connected together;

at least one MOSFET in each said set of MOSFETs also having a separately metallized current-sensing pad which is representative of current flow in all said parallel connected MOSFETs in a set of MOSFETs, said current-sensing pad being coupled to control all said gates in said set of MOSFETs to limit maximum MOSFET current.

11. The power circuit of claim 10 wherein a 3-phase motor is connected to said first, second and third phase lines, said 3-phase motor being for driving an air charging compressor in an internal combustion engine-motor-charge air compressor combination.

12. The power circuit of claim 11 wherein said gates of said MOSFETs in each of said three sets of MOSFETs are connected to a controller, said controller receiving throttle signals and controlling said gates and operation of said MOSFETs to power said first, second and third phase lines for driving said 3-phase motor and air changing compressor in response to said throttle signals.

13. The power circuit of claim 10 further including a metallized Kelvin portion.

14. A power circuit for controlling a 3-phase motor, comprising:

a source of direct current;

first, second and third sets of parallel connected MOSFETs connected to said source of direct current;

first, second and third phase lines, said first, second and third sets of MOSFETs being respectively connected to said first, second and third phase lines so that energization of one set of MOSFETs energizes its corresponding phase line;

each of said sets of parallel connected MOSFETs comprising a plurality of individual MOSFETs, each individual MOSFET having a drain, a power source and a gate, said gates of said individual MOSFETs in a set being connected together;

at least one individual MOSFET in each said set of MOSFETs also having a separately metallized current-sensing portion which is representative of current flow in all said parallel connected MOSFETs in a set of MOSFETs and a separately metallized Kelvin source portion, said current sensing portion and said Kelvin source portion for each said first, second and third sets of parallel connected MOSFETs being respectively connected to first, second and third operational amplifiers, said first, second and third operational amplifiers being connected together to produce an output which represents an over-current output, said output being coupled back to said MOSFET gates to limit MOSFET current in each of said first, second and third sets of parallel connected MOSFETs to safe values.

15. The power circuit of claim 14 wherein a 3-phase motor is connected to said first, second and third phase lines, said 3-phase motor being for driving a charger compressor in an internal combustion engine-motor-charge air compressor combination.

* * * * *